(12) United States Patent
Kenneth

(10) Patent No.: US 8,193,044 B2
(45) Date of Patent: Jun. 5, 2012

(54) MEMORY CELLS

(75) Inventor: Trevor Monk Kenneth, Gwent (GB)

(73) Assignee: Icera Inc., Wilmington, DE (US)

( * ) Notice: Subject to any disclaimer, the term of this patent is extended or adjusted under 35 U.S.C. 154(b) by 0 days.

(21) Appl. No.: 12/810,786

(22) PCT Filed: Oct. 24, 2008

(86) PCT No.: PCT/EP2008/064459
§ 371 (c)(1),
(2), (4) Date: Mar. 9, 2011

(87) PCT Pub. No.: WO2009/059906
PCT Pub. Date: May 14, 2009

(65) Prior Publication Data
US 2012/0001270 A1    Jan. 5, 2012

(30) Foreign Application Priority Data
Nov. 8, 2007  (GB) .................................. 0721940.5

(51) Int. Cl.
*H01L 21/82* (2006.01)
(52) U.S. Cl. ................. 438/129; 438/599; 257/E21.598

(58) Field of Classification Search ............. 438/23, 438/83, 141, 194, 599; 257/E21.532, E21.533, 257/E21.534, E21.598, E21.613
See application file for complete search history.

(56) References Cited

U.S. PATENT DOCUMENTS
| 5,331,170 A | 7/1994 | Hayashi |
| 5,635,731 A | 6/1997 | Ashida |
| 5,952,678 A | 9/1999 | Ashida |

FOREIGN PATENT DOCUMENTS
WO      2009059906 A1    5/2009

*Primary Examiner* — Cheung Lee

(57) ABSTRACT

A method of manufacturing an integrated circuit (IC), comprising: defining a plurality of continuous active areas; forming conducting lines extending over the active areas; and using the conducting lines as a mask, introducing dopant into the active areas. Connections are provided between doped regions and conducting lines to form first and second circuit portions, at least one active area being continuous between those portions. In that active area, connections are provided between doped regions and conducting lines to form a pair of diode-connected transistors in reverse bias to one another between the first and second circuit portions, connected so as to leave a shared, unconnected doped region between the pair. The present invention also relates to a corresponding IC.

15 Claims, 7 Drawing Sheets

MEMORY CELLS

CROSS-REFERENCE TO RELATED APPLICATION

This application is the National Stage of, and therefore claims the benefit of International Application No. PCT/EP2008/064459 filed on Oct. 24, 2008, entitled "MEMORY CELLS," which was published in English under International Publication Number WO 2009/059906 on May 14, 2009, and has priority based on GB 0721940.5 filed on Nov. 8, 2007. Each of the above applications is commonly assigned with this National Stage application and is incorporated herein by reference in their entirety.

FIELD OF THE INVENTION

The present invention relates to the memory cells of a memory device and the manufacture thereof.

BACKGROUND

There is ongoing pressure to make memory cells such as static RAM (SRAM) cells smaller. As process technologies shrink into deep-submicron (e.g. 65 nm, 45 nm and 32 nm), the manufacturability of these tiny SRAM cells becomes far harder. In large part, this is due to the photolithography patterns being increasingly difficult to define accurately on the wafer.

Manufacturable SRAM cells must be as small as possible whilst maintaining tight control over their device parameters in order to guarantee operation across the full product specification. Sometimes it is necessary to use larger transistors in an SRAM cell in order to keep the manufacturing variation within acceptable limits: so there is a trade-off between cell area and device variability.

A technique that reduces the manufacturing variability of devices in an SRAM cell would be desirable, as it would enable a wider product operating range and/or a smaller cell area.

A typical SRAM memory device is now described with reference to FIG. 1. The device comprises an N by M array 12 of memory cells 14, with N columns and M rows where N and M are any integer. A plurality (M) of bit lines $BL_1 \ldots BL_M$ and a plurality (N) of word lines $WL_1 \ldots WL_N$ are formed in the device. Within each row, each cell 14 is connected to a bit line BL of the respective row. Within each column, each cell 14 is connected to a word line WL of the respective column.

The bit lines BL and world lines WL are connected to addressing, reading and writing logic (not shown) as known in the art. For each bit line BL, there may also be formed a respective corresponding inverse bit line $\overline{BL}$ (not shown), which is not strictly necessary but improves tolerance to noise.

In operation, access to a cell 14 is enabled by asserting its corresponding word line WL (only one word line WL is asserted at any one time). In a read cycle, this allows the stored binary value of each cell 14 of that word line WL to be read from each of the respective bit lines $BL_1 \ldots BL_M$. In a write cycle, this allows a binary value to be stored in each cell 14 of that word line WL by driving that value onto each of the respective bit lines $BL_1 \ldots BL_M$. In standby state, no word line WL is asserted and each cell 14 simply stores its respective value.

FIG. 2 is a circuit diagram showing two conventional memory cells $14_n$ and $14_{n+1}$ as might typically be formed in part of the array 12, the cells $14_n$ and $14_{n+1}$ being on adjacent word lines $WL_n$ and $WL_{n+1}$ respectively on the same bit line BL. Each cell 14 of this example is a CMOS "6T" (six transistor) SRAM cell, formed comprising a first transistor 1 and a second transistor 2 connected together as a cross-coupled pair, a third transistor 3 and a fourth transistor 4 connected together as another cross-coupled pair, and a fifth transistor 5 and a sixth transistor 6 each connected as an access transistor. The first and third transistors 1 and 3 together form an inverter, and the second and fourth transistors 2 and 4 together form another inverter, and the two inverters may also be described as cross-coupled. Each row of cells 14 is formed with both bit line BL and its inverse $\overline{BL}$. A memory cell arrangement of this type is known in the art.

As shown, a first terminal of the first transistor 1 is connected to a supply 9, a first terminal of the second transistor is connected to the supply 9, the control terminal of the first transistor 1 is connected to a second terminal of the second transistor 2, and the control terminal of the second transistor 2 is connected to a second terminal of the first transistor. A first terminal of the third transistor is connected to ground 10, a first terminal of the fourth transistor 4 is connected to ground 10, the control terminal of the third transistor 3 is connected to a second terminal of the fourth transistor 4, and the control terminal of the fourth transistor 4 is connected to a second terminal of the third transistor 3. The second terminal of the first transistor 1 is connected to the second terminal of the third transistor 3, and the second terminal of the second transistor 2 is connected to the second terminal of the fourth transistor 4. A second terminal of the fifth transistor 5 is connected to the bit line BL, a first terminal of the fifth transistor 5 is connected to the second terminal of the third transistor 3 and the control terminal of the second transistor 2, and the control terminal of the fifth transistor 5 is connected to the $n^{th}$ word line $WL_n$. A second terminal of the sixth transistor 6 is connected to the inverse bit line $\overline{BL}$, a first terminal of the sixth transistor 6 is connected to the second terminal of the fourth transistor 4 and the control terminal of the first transistor 1, and the control terminal of the sixth transistor 6 is connected to the $n^{th}$ word line $WL_n$.

In the case where the transistors are MOSFETs (Metal Oxide Field Effect Transistors), the control terminal of each is the gate, the first terminal of each is the source, and the second terminal of each is the drain. In the illustrated example, the first and second transistors 1 and 2 are PMOS transistors (p-type MOSFETs); and the third, fourth, fifth and sixth transistors 3, 4, 5 and 6 are NMOS transistors (n-type MOSFETS); n-type being the opposite of p-type.

The structure of the adjacent cell $14_{n+1}$ is substantially the same, but with the second terminal corresponding to that of the fifth transistor 5 connected to the inverse bit line $\overline{BL}$, the second terminal corresponding to that of the sixth transistor 6 connected to the bit line BL, and the control terminals corresponding to those of the fifth and sixth transistors 5 and 6 connected to the $n+1^{th}$ word line $WL_{n+1}$. The pattern is repeated alternately across each bit line BL for as many bits as are required in a word, and for as many words as are required.

In operation, each cell 14 has only two possible steady states. In a write cycle, the write line signal is asserted at the control terminals of the fifth and sixth transistors 5 and 6 such that they each turn on, i.e. each conduct to form an electrical connection between their respective first and second terminals. A binary value is then driven onto the bit line BL and the inverse of the value is driven onto the inverse bit line $\overline{BL}$. Then, depending on that value, the cell adopts one of the two steady states. That is, either the first and fourth transistors 1 and 4 turn on (i.e. conduct between their respective first and second terminals) whilst the second and third transistors 2 and 3 turn off (i.e. do not conduct between their respective first and terminals), such that the node 11 between the first and third transistors 1 and 3 is forced up to the supply voltage 9 and the node 13 between the second and fourth transistors 2 and 4 is forced down to the ground 10; or vice versa. Note that the bit line input-drivers (not shown) are strong enough to override the previous state of the cross-coupled inverters.

When the write cycle is ended, the write line signal is de-asserted and the cell retains whichever of these two steady states it was driven into. In a read cycle, the word line signal is again asserted at the control terminals of the fifth and sixth transistors 5 and 6, and the corresponding value will appear on the bit line BL (and its inverse on the inverse bit line $\overline{BL}$) depending on which steady state the cell was left in.

FIG. 3 is a partial plan view of an example integrated circuit (IC) package containing the memory device of FIGS. 1 and 2, showing a portion of the layout of the array 12 (not necessarily to scale). FIG. 4 is a cross section through line A of FIG. 3.

The package comprises active areas 16, shown here schematically as the dotted areas, these being the areas of silicon in which p-n junction devices such as MOSFETs and/or other transistors are formed. The term "active area" will be understood by a person skilled in the art. The package also comprises interconnects 17, shown here schematically as the cross-hatched areas, which are preferably polysilicon and form conducting connections within the illustrated layer of the package (in the plane of the page). The package also comprises vertical interconnects 15, shown here schematically as crossed squares, which form vertical conducting connections (perpendicular to the page) to a metalisation layer which connects between other such interconnects 15. The metallisation layer is not shown here, but the connections for a conventional memory cell will be known to a person skilled in the art. The package also comprises insulating mask areas 18, shown here schematically as the blank areas within the illustrated portion, which are preferably silicon oxide and act to mask against doping when the devices are formed in the active areas 16. An individual cell 14 is marked out for the purpose of illustration with a dotted line. It will be appreciated by a person skilled in the art that the pattern for a cell 14 repeats or tessellates over a wider area than is illustrated to form an array of such cells.

In the illustrated example, the third, fourth, fifth and sixth transistors 4, 5, 6 and 7 are NMOS devices formed in a first area of active area silicon 16 comprising upper and lower portions 20 and 23; and the first and second transistors 1 and 2 are PMOS devices formed in a second area of active area silicon 16 comprising central portions 21 and 22. The exact details of which transistors are formed where and how they are connected by the metalisation layer are not discussed in detail here, but CMOS memory cells are well known and these details will be apparent to a person skilled in the art.

In manufacture, the layout of FIG. 3 is built up as follows. First is provided a silicon substrate 26, in this case p-type, on which a layer of silicon oxide 18 is formed. Portions of this oxide 18 are etched away by photolithography to form the required pattern, i.e. to expose the areas where devices will be formed.

A PMOS transistor has an n-type channel and a p-type source and drain, formed by adding p-type dopant to an n-type foundation. Accordingly, since the substrate in this example is p-type, n-wells 27 are then formed in the central portions 21 and 22 of the active area 16 to provide an n-type foundation in which PMOS transistors can be formed. Conversely, an NMOS transistor has a p-type channel and an n-type source and drain, formed by adding n-type dopant to a p-type foundation. The substrate in this case is already p-type, no well is required in the upper and lower portions 20 and 23 of the active area 16.

Next, the polysilicon interconnects 17 are laid down. Then p-type dopant 28 is added to the central portions 20 and 21 of the active areas 16 where the PMOS transistors are formed, and n-type dopant is added to the upper and lower portions 20 and 23 where the NMOS transistors are formed. The combination of the remaining oxide 18 and the polysilicon interconnects 17 act as a mask for this doping stage (referred to in the art as "self aligned source drain doping"). These newly doped areas form the sources and drains of the transistors, upon which vertical interconnects 15 to the metalisation layer are laid. Wherever a polysilicon interconnect 17 crosses the active area 16, a gate is formed, and the doped areas either side of that interconnect 17 form the corresponding source and drain (the devices is symmetric so that either terminal can be the source or drain).

Finally, further insulation (not shown) is added to cover the exposed silicon of the active areas 16, the metalisation layers (also not shown) are formed, and the device is packaged into an integrated circuit package.

Note that the figures are somewhat schematic, especially with reference to FIG. 4 in that a thin insulating layer (not shown) of oxide 18 is actually left beneath the interconnects 17 in the regions of active area 16 where they cross to form a gate, as will be familiar to a person skilled in the art. The heights of the various illustrated elements in FIG. 4 are also not necessarily to scale. Further, note that in the above manufacturing process, a number of additional stages of masking will be required (e.g. when forming the n-wells), which again will be familiar to a person skilled in the art and for brevity are not described herein.

This layout topology is referred to as "split bit line" because the connections to the bit lines are made at opposite sides of the memory cell (e.g. top and bottom active area stripes 20 and 23). This topology is widely known in the prior art. There are other cell topologies which can also be used to realise the same circuit, however they have fallen out of favour since the end of the last millennium.

The PMOS devices 1 and 2 form a series of rectangular shapes 29 in the active area regions 21 and 22 interspersed by separating gaps 19 where the oxide 18 remains, and the NMOS devices 3, 4, 5 and 6 form two continuous strips 20 and 23 of active area 16. The gaps 19 provide electrical isolation to ensure there is no electrical interaction between cells 14. The gaps 19 also provide space for a polysilicon interconnects 17 to reach the opposite side of a cell 14 to create the described cross coupling.

As discussed, it would be advantageous to reduce the manufacturing variability of these and other types of memory arrays.

SUMMARY

According to one aspect of the present invention, there is provided a method of manufacturing an integrated circuit, the method comprising: defining a plurality of continuous active areas where devices are to be formed; forming a plurality of conducting lines extending over the active areas; using the conducting lines as a mask, introducing dopant into the active areas to form doped regions; providing connections between some of the doped regions and conducting lines to form a first circuit portion and a second circuit portion, at least one of said active areas being continuous between the first and second circuit portions; and in said at least one active area, providing connections between some of the doped regions and conducting lines to form a pair of diode-connected transistors in reverse bias to one another between the first and second circuit portions, connected so as to leave a shared, unconnected doped region between the diode-connected transistors.

According to another aspect of the invention, there is provided a method of manufacturing a memory, the method comprising: defining a plurality of active areas where devices are to be formed, including two continuous active areas of a first doping type, and two continuous active areas of an opposite second doping type; forming a plurality of conducting lines extending from an active area of a first type over an active area of a second type; using the conducting lines as a mask, introducing dopant of the first type into the active areas of the second type to form a plurality of first type doped regions; introducing dopant of the second type into the active areas of the first type to form a plurality of second type doped regions; providing connections between some of said doped regions and conducting lines so as to form first and second memory cells, each having a first transistor formed in each active area of the first type, and a second transistor formed in each active area of the second type, wherein the control terminals of the transistors are formed by the conducting lines; and in one of the active areas of the second type, between the corresponding second transistor of the first memory cell and second transistor of the second memory cell, providing connections between some of said first type doped regions and conducting lines to form a pair of diode-connected transistors in reverse bias to one another between the cells, connected so as to leave a shared, unconnected first type doped region between the diode-connected transistors.

By the inclusion of a non-operative, electrically isolating silicon structure between cells, formed in a region where a conducting line crosses a cell, a gap in the silicon can be eliminated thus allowing the cells to be manufactured with a larger continuous area of silicon. The inventor has recognised that small rectangular shapes in the active area of an integrated circuit increase manufacturing variability. Particularly, in deep-submicron photolithography, it is far easier to define a narrow stripe than a series of small rectangular shapes. Therefore the manufacturing variability of memory cell transistors is smaller (i.e. better) when they are created using a longer stripe of active area. Thus the invention advantageously allows for higher yield and better product control.

Further, it is possible to manufacture long stripes with a narrower width than would be possible if the stripe were broken into a series of smaller rectangles. The resulting memory cell transistors may therefore be made smaller and the memory cell area thereby reduced. Such smaller devices can have the additional advantage of extending the low-voltage writeability of the memory cell, helping to ensure operation across the full product specification.

So the invention advantageously allows reduced manufacturing variability for a given cell size, or equivalently reduced cell size for a given manufacturing variability, or indeed an improved trade-off between the two.

Further, note that although the additional structure between the cells may result in extra leakage current, the inventor has realised that this effect is outweighed by the benefits of reduced manufacturing variability and/or cell size resulting from the invention.

Further, the arrangement of diode-connected transistors provides the required isolation in a way that is easy to manufacture within the continuous active area with minimal cell size and manufacturing variation, and also, if required by the topography, may provide a convenient way to allow a polysilicon interconnect to cross over the cell without substantially affecting its operation.

In further embodiments, the two active areas of the second type may be defined between the active areas of the first type.

The forming of the conducting lines may comprise, for each cell, forming two lines each intersecting with both active areas of the second type.

Each of the first and second memory cells may be further formed having two access transistors.

Each of the first and second memory cells may be formed having one of said access transistors in each of the active areas of the first type.

The providing of connection may comprise, for each of the first and second cells, connecting the first transistors as a first cross-coupled pair and the second transistors as second cross-coupled pair.

The memory may be formed as an SRAM.

Memory devices of these types will benefit particularly from present invention, their layout being particularly compatible with the invention from a manufacturing point of view.

According to another aspect of the present invention, there is provided a memory comprising: a plurality of active areas where devices are formed, including two continuous active areas of a first doping type, and two continuous active areas of an opposite second doping type; a plurality of conducting lines extending from an active area of a first type over an active area of a second type; first and second memory cells, each having a first transistor formed in each active area of the first type, and a second transistor formed in each active area of the second type; a pair of diode-connected transistors in reverse bias to one another between the cells, formed from regions of dopant of the first type introduced into one of the active areas of the second type between the corresponding second transistor of the first memory cell and second transistor of the second memory cell, the dopant being separated where conducting lines extend over that active area of the second type and there being a shared, unconnected first type doped region between the diode-connected transistors.

BRIEF DESCRIPTION OF THE DRAWINGS

For a better understanding of the present invention and to show how the same may be carried into effect, reference will now be made by way of example to the accompanying drawings.

DETAILED DESCRIPTION OF PREFERRED EMBODIMENTS

Figure 1:
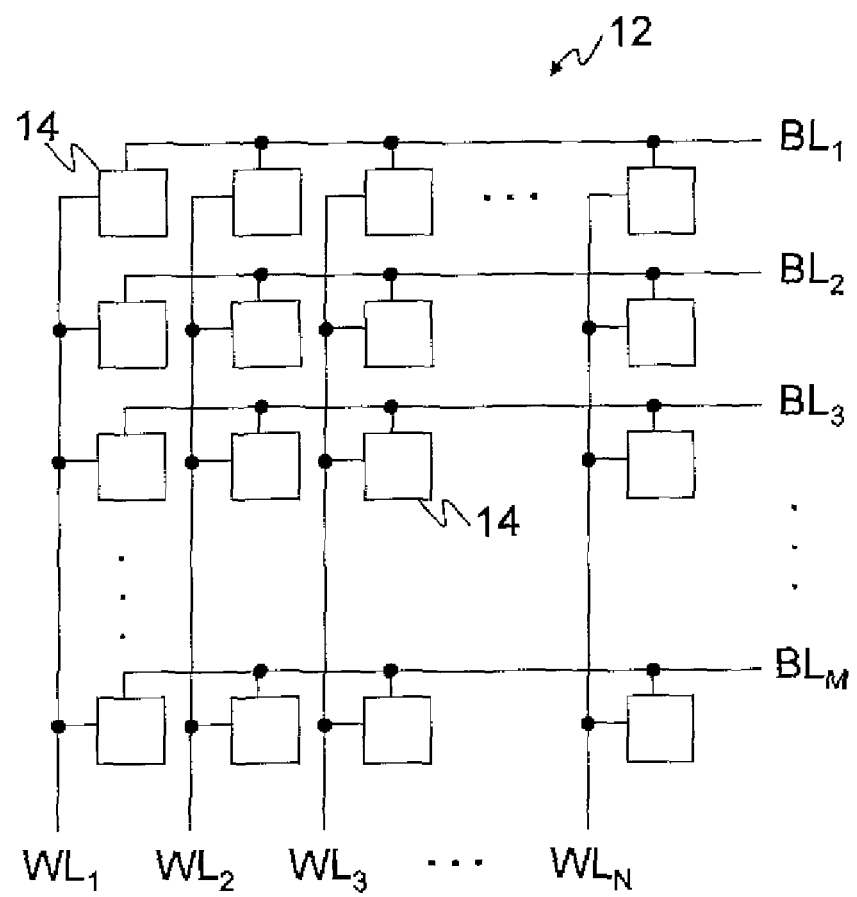
FIG. 1 shows a memory cell array.
Figure 2:
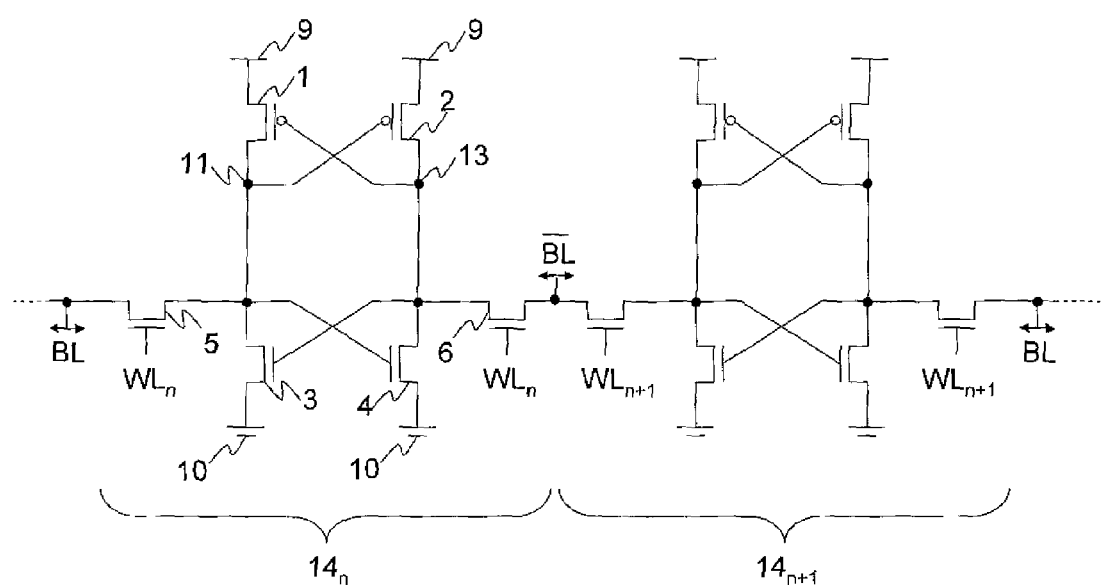
FIG. 2 is circuit diagram of a pair of adjacent cells in the array.
Figure 5:
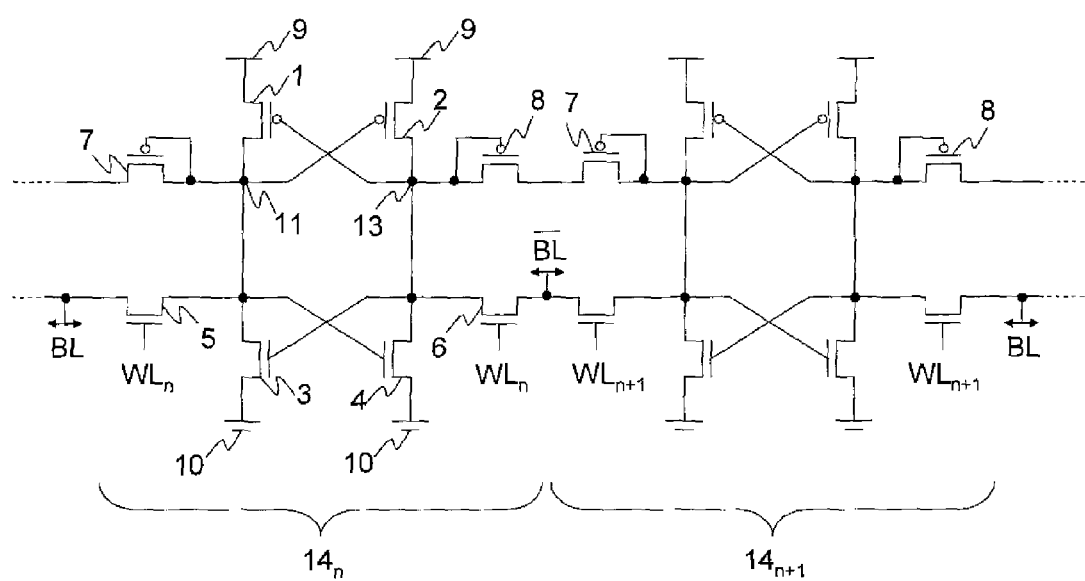
FIG. 5 is a circuit diagram of an improved pair of adjacent memory cells.

FIG. 5 is the equivalent circuit diagram of an exemplary embodiment of the present invention, showing two adjacent memory cells $14_n$ and $14_{n+1}$. The circuit is substantially similar to that described in relation to FIG. 2, except that each cell 14 comprises an additional non-operative, electrically isolating p-n junction structure between the cells $14_n$ and $14_{n+1}$, preferably in the form of a seventh transistor 7 and eighth transistor 8.

The transistor structure 7, 8 electrically isolates between the adjacent cells $14_n$ and $14_{n+1}$, i.e. so that no signal or current passes through it between the adjacent cells $14_n$ and $14_{n+1}$ (ignoring side effects such as leakage current and some additional capacitance). The additional structure 7, 8 is also "non-operative" in the sense that it does not interact with any other component, and does not perform any function other than the electrical isolation (again ignoring side effects such as leakage current and some additional capacitance). Preferably, each of the seventh and eighth transistors 7 and 8 is diode connected in reverse polarity with the other.

Note that although the sixth transistor 6 of once cell $14_n$ and the fifth transistor 5 of the next adjacent cell $14_{n+1}$ never allow conduction between the cells (because $WL_n$ and $WL_{n+1}$ are never simultaneously asserted), they do allow for conduction between a cell and the read and write circuitry (not shown) of the memory device via the bit line pair BL, $\overline{BL}$ when the appropriate. Thus these fifth and sixth transistors 5 and 6 cannot be said to be non-operative.

As shown, a first terminal of the seventh transistor 7 is connected to a first terminal of the eighth transistor 8 of the previous adjacent cell, and a second terminal of the seventh transistor 7 is connected to the control terminal of that seventh transistor 7 and to the node between the second terminal of the first transistor 1 and the second terminal of the third transistor 3. Further, a first terminal of the eighth transistor 8 is connected to the first terminal of the seventh transistor of the next adjacent cell, and a second terminal of the eighth transistor 8 is connected to the control terminal of the eighth transistor 8 and to the node between the second terminal of the second transistor 2 and the second terminal of the fourth transistor 4.

Again, in the case where the transistors are MOSFETs, the control terminal of each is the gate, the first terminal of each is the source, and the second terminal of each is the drain. If the first and second transistors 1 and 2 are PMOS transistors, then the seventh and eighth transistors 7 and 8 are preferably also PMOS transistors so they can be more easily formed in the same strips of active area as the first and second transistors 1 and 2 (see below).

Although the adjacent cells $14_n$ and $14_{n+1}$ on a bit line pair BL, $\overline{BL}$ appear to be linked, the new devices 7 and 8 are diode connected in reverse polarity so it is impossible for both to conduct simultaneously. Thus in operation, the circuit of FIG. 5 functions substantially the same as described in relation to FIG. 2.

In fact, the extra devices 7 and 8 may actually add some gate capacitance, which advantageously results in a greater dynamic stability.

On the downside, if different data is in adjacent cells, then one device will have a leakage current $I_{off}$. But this will be small because $V_{DS}=V_{DD}-V_T$, where $V_{DD}$ is the supply voltage, $V_T$ is the gate threshold voltage at which the device starts to conduct, and $V_{DS}$ is the voltage between drain and source of the device. There may also be a very small extra gate current due to tunnelling effects. Nonetheless, these extra leakage currents are believed to be the only downside to the new layout, and the inventor has discovered that, surprisingly, the trade-off between the increased leakage current and the easier photolithography allowed by the new layout is still worthwhile.

Figure 6:
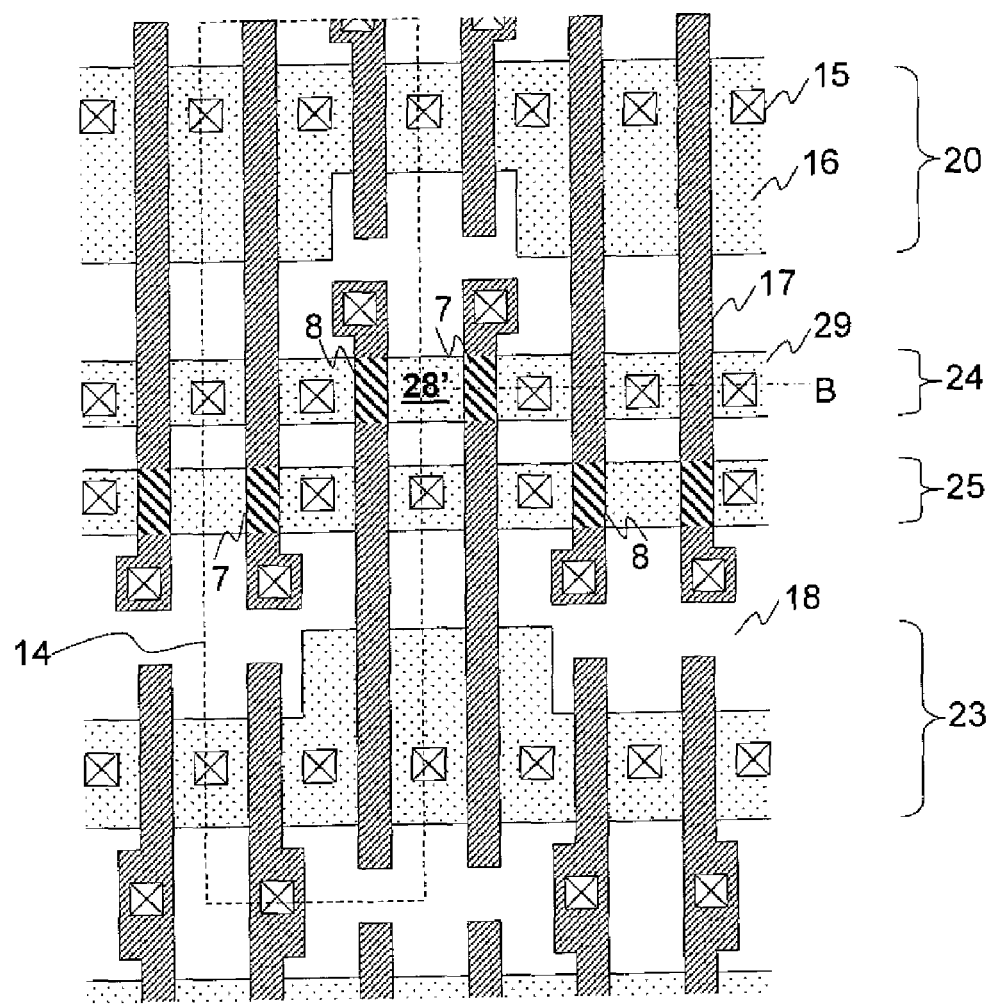
FIG. 6 shows an IC package layout for the circuit of FIG. 4.
Figure 7:
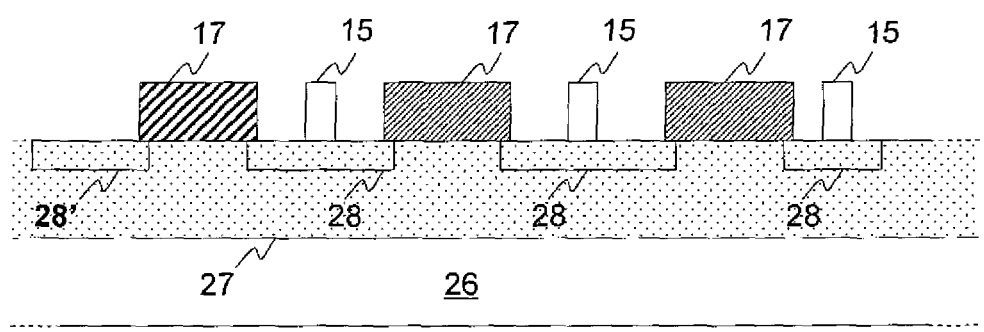
FIG. 7 is a cross section of FIG. 6.

An example of such a layout is now discussed in relation to FIG. 6, which is a partial plan view of an example integrated circuit (IC) package containing the memory device of FIG. 5, showing a portion of an array 12 (not necessarily to scale). FIG. 7 is a cross section through the line B of FIG. 6.

Figure 3:
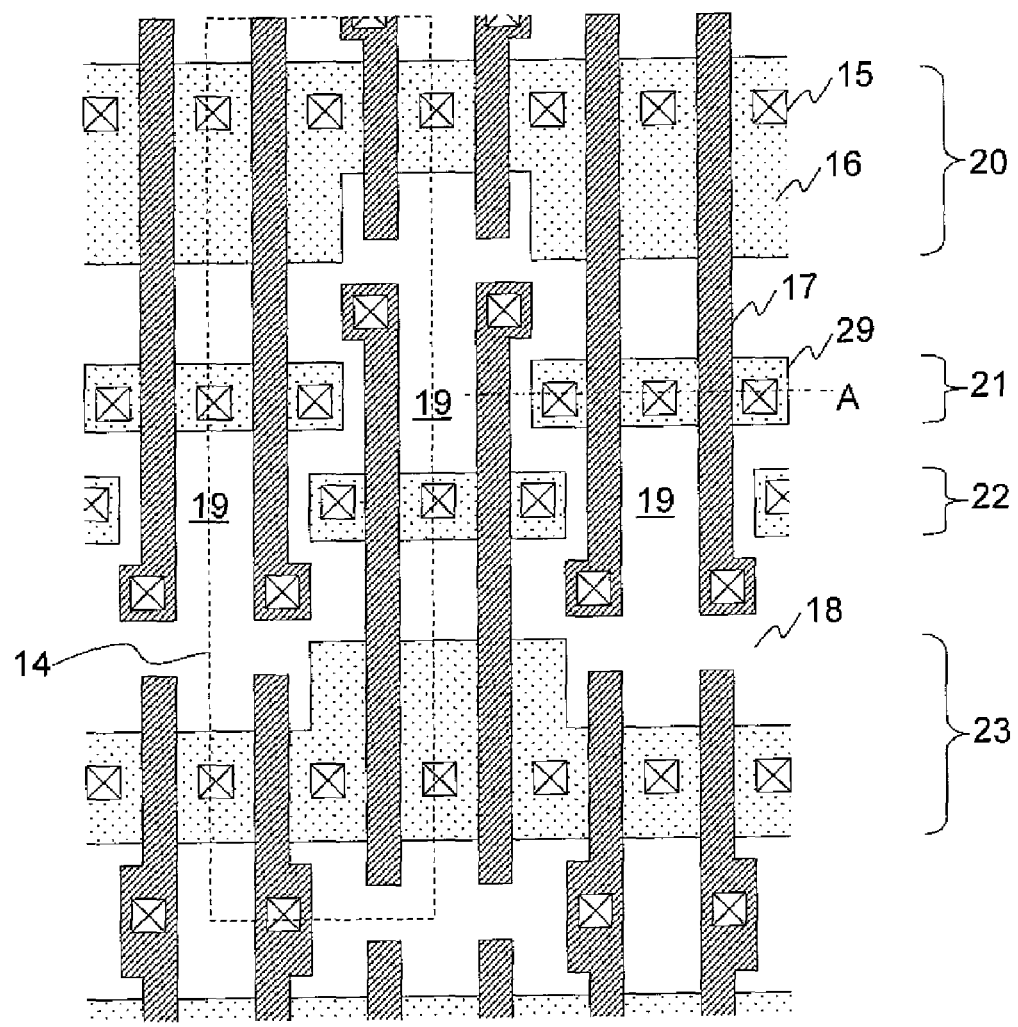
FIG. 3 shows an IC package layout for the circuit of FIG. 2.
Figure 4:
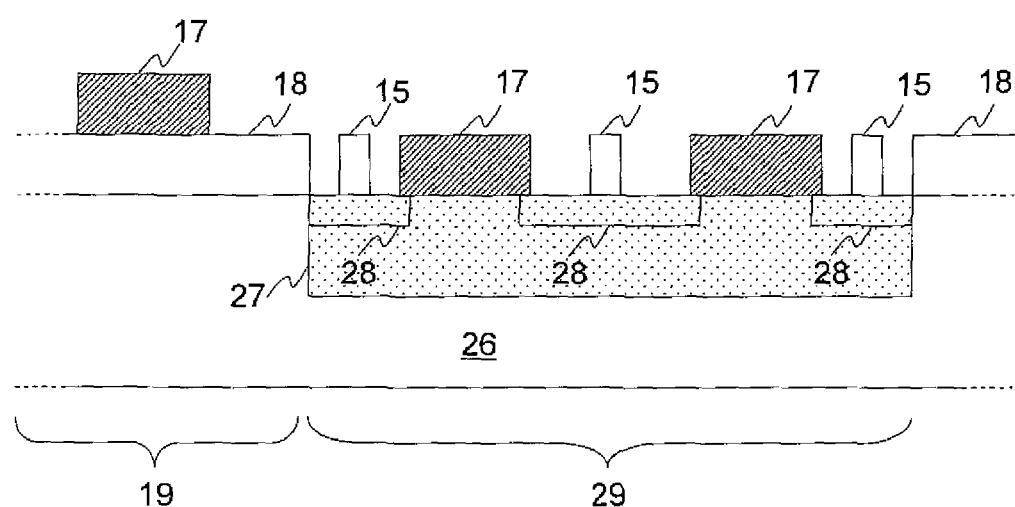
FIG. 4 shows a cross-section of FIG. 3

The layout is similar to that of FIGS. 3 and 4, except instead of smaller rectangular areas 29 with gaps 19 therebetween, the second area comprises two long stripes 24 and 25 of active area in which the additional devices 7 and 8, shown diagrammatically by the broad diagonal hatching, are formed. Some of the polysilicon interconnects 17 must now cross the middle active areas 24 and 25 in order to reach the opposite side of the cell. Where the polysilicon crosses the active area, this is where the additional transistors 7 and 8 are formed, preferably PMOS transistors. The extra devices 7 and 8 are formed beneath the relevant interconnect 17 and connect with it. The additional transistors 7 and 8 provide the necessary electrical isolation between adjacent memory cells without substantially affecting the cell performance. At the same time, the fact that the middle portions 24 and 25 are formed as continuous strips of active area means that manufacturing variation is reduced compared to the rectangular shapes 29 with gaps 19 as in FIGS. 3 and 4.

The connection between the second terminal and the control terminal (e.g. gate) of the seventh transistor 7 is formed in the metalisation layer. Similarly, the connection between the second terminal and the control terminal of the eighth transistor 8 is formed in the metalisation layer. But the connection between the first terminals of the seventh and eighth transistors 7 and 8 of adjacent cells is formed only by a new shared, continuous doped region 28' in an active area 24 or 25 in the centre between the two new transistors. This new doped region 28' has no connection to any other devices, i.e. no connection with an interconnect 17 nor a vertical connection 15 to the metalisation layer.

In manufacture, the process is as described in relation to FIGS. 3 and 4, except that the etching pattern of the oxide 18 is different in order to form the longer strips 24 and 25, and as a result the additional doped areas 28' are also created to form the new devices 7 and 8. Further, note how the polysilicon interconnects 17 over the new devices 7 and 8 also act as a mask when adding the p-type dopant to the n-well to form the new doped areas 28'.

The first, second, seventh and eighth transistors 1, 2, 7 and 8 are all of the same type (i.e. p-type or n-type) and same kind (preferably MOSFETS). This simplifies the manufacturing of the strips 24 and 25 and facilitates the reduced manufacturing variability. Similarly, preferably the third, fourth, fifth and sixth transistors 3, 4, 5 and 6 are of the same type and kind, with the opposite type to that of the first, second, seventh and eighth transistors 1, 2, 7 and 8 (i.e. n-type or p-type respectively) and the same kind (preferably MOSFET).

Note also that the use of reverse-bias diode-connected transistors 7 and 8 as illustrated is a particularly efficient way of achieving the required isolation from a manufacturing point of view. It also allows the relevant interconnects 17 to cross over and connect with the transistors 7 and 8 without having any substantial effect on the operation of the cell (ignoring leakage current and the extra capacitance), thus allowing easy manufacture of the cross coupled pairs.

Thus, the inventor has realised that there is no need to etch rectangular shapes 29 and gaps 19 to provide electrical isolation between cells or to allow space for interconnects 17 to cross over, because if the interconnect 17 is actually deliberately allowed to cross the active area then additional devices can be formed and arranged so as to provide the required isolation. This advantageously reduces manufacturing variability due to the consequentially longer active areas 16, with no gaps 19.

It will be appreciated that the above embodiments are described only by way of example. Other variations may be apparent to the person skilled in the art. For example, the above has been described in relation to the example of split bit line 6T SRAM cells, but the principle of the invention may be applied to other sorts of memory cell such 8T (8 transistor) cells (e.g. as used for dual-port SRAMs), register file cells, DRAM cells or flash memory cells. The invention can also be implemented with other types of transistor, e.g. by swapping PMOS and NMOS transistors, or by using different kinds such as bipolar transistors or JFETs. Other cell topographies may also benefit from the principle of the present invention. The invention could also apply to separating integrated circuit portions other than memory cells, for example in analogue circuitry. The scope of the invention is not limited by the described embodiments, but only by the following claims.

The invention claimed is:

1. A method of manufacturing an integrated circuit, the method comprising:
   defining a plurality of continuous active areas where devices are to be formed;
   forming a plurality of conducting lines extending over the active areas;
   using the conducting lines as a mask, introducing dopant into the active areas to form doped regions;
   providing connections between some of the doped regions and conducting lines to form a first circuit portion and a second circuit portion, at least one of said active areas being continuous between the first and second circuit portions; and
   in said at least one active area, providing connections between some of the doped regions and conducting lines to form a pair of diode-connected transistors in reverse bias to one another between the first and second circuit portions, connected so as to leave a shared, unconnected doped region between the diode-connected transistors.

2. A method of manufacturing a memory, the method comprising:
   defining a plurality of active areas where devices are to be formed, including two continuous active areas of a first doping type, and two continuous active areas of an opposite second doping type;
   forming a plurality of conducting lines extending from an active area of a first type over an active area of a second type;
   using the conducting lines as a mask, introducing dopant of the first type into the active areas of the second type to form a plurality of first type doped regions;
   introducing dopant of the second type into the active areas of the first type to form a plurality of second type doped regions;
   providing connections between some of said doped regions and conducting lines so as to form first and second memory cells, each having a first transistor formed in each active area of the first type, and a second transistor formed in each active area of the second type, wherein control terminals of the transistors are formed by the conducting lines; and
   in one of the active areas of the second type, between the corresponding second transistor of the first memory cell and second transistor of the second memory cell, providing connections between some of said first type doped regions and conducting lines to form a pair of diode-connected transistors in reverse bias to one another between the cells, connected so as to leave a shared, unconnected first type doped region between the diode-connected transistors.

3. The method according to claim 2, wherein the two active areas of the second type are defined between the active areas of the first type.

4. The method according to claim 2, wherein the forming of the conducting lines comprises, for each cell, forming two lines each intersecting with both active areas of the second type.

5. The method according to claim 2, wherein each of the first and second memory cells is further formed having two access transistors.

6. The method according to claim 5, wherein each of the first and second memory cells is formed having one of said access transistors in each of the active areas of the first type.

7. The method according to claim 2, wherein the providing of connections comprises, for each of the first and second cells, connecting the first transistors as a first cross-coupled pair and the second transistors as second cross-coupled pair.

8. The method according to claim 2, wherein the memory is formed as an SRAM.

9. A memory comprising:
   a plurality of active areas where devices are formed, including two continuous active areas of a first doping type, and two continuous active areas of an opposite second doping type;
   a plurality of conducting lines extending from an active area of a first type over an active area of a second type;
   first and second memory cells, each having a first transistor formed in each active area of the first type, and a second transistor formed in each active area of the second type; and
   a pair of diode-connected transistors in reverse bias to one another between the cells, formed from regions of dopant of the first type introduced into one of the active areas of the second type between the corresponding second transistor of the first memory cell and second transistor of the second memory cell, the dopant being separated where conducting lines extend over that active area of the second type and there being a shared, unconnected first type doped region between the diode-connected transistors.

10. The memory according to claim 9, wherein the two active areas of the second type are situated between the active areas of the first type.

11. The memory according to claim 9, wherein the conducting lines comprise, for each cell, forming two lines each intersecting with both active areas of the second type.

12. The memory according to claim 9, wherein each of the first and second memory cells comprises two access transistors.

13. The memory according to claim 12, wherein each of the first and second memory cells has one of said access transistors in each of the active areas of the first type.

14. The memory according to claim 9, wherein for each of the first and second cells, the first transistors are connected as a first cross-coupled pair and the second transistors are connected as a second cross-coupled pair.

15. The memory according to claim 9, wherein the memory is an SRAM.

* * * * *